(12) United States Patent
Tang

(10) Patent No.: US 12,020,754 B2
(45) Date of Patent: Jun. 25, 2024

(54) NON-VOLATILE MEMORY DEVICE FOR MITIGATING CYCLING TRAPPED EFFECT AND CONTROL METHOD THEREOF

(71) Applicant: Vanguard International Semiconductor Corporation, Hsinchu (TW)

(72) Inventor: Po-Yuan Tang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 122 days.

(21) Appl. No.: 17/878,933

(22) Filed: Aug. 2, 2022

(65) Prior Publication Data

US 2024/0046997 A1 Feb. 8, 2024

(51) Int. Cl.
| | | |
|---|---|---|
| *G11C 16/28* | (2006.01) | |
| *G11C 7/14* | (2006.01) | |
| *G11C 16/04* | (2006.01) | |
| *G11C 16/10* | (2006.01) | |
| *G11C 16/14* | (2006.01) | |
| *G11C 16/20* | (2006.01) | |
| *G11C 16/34* | (2006.01) | |

(52) U.S. Cl.
CPC ............ *G11C 16/20* (2013.01); *G11C 7/14* (2013.01); *G11C 16/0408* (2013.01); *G11C 16/102* (2013.01); *G11C 16/14* (2013.01); *G11C 16/28* (2013.01); *G11C 16/34* (2013.01); *G11C 2211/5634* (2013.01)

(58) Field of Classification Search
CPC .. G11C 16/20; G11C 7/04; G11C 7/14; G11C 11/4099; G11C 16/102; G11C 16/14; G11C 16/28; G11C 2211/5634
See application file for complete search history.

(56) References Cited

U.S. PATENT DOCUMENTS

2008/0151619 A1* 6/2008 Melik-Martirosian ............... G11C 16/344
365/185.3

* cited by examiner

*Primary Examiner* — Jay W. Radke
(74) *Attorney, Agent, or Firm* — Winston Hsu

(57) ABSTRACT

A non-volatile memory device includes a set of memory cells, a cycle transistor, a reference transistor and a control circuit. The control circuit is coupled to the set of memory cells, the cycle transistor and the reference transistor. A method of controlling the non-volatile memory device includes in a program operation or an erase operation of the set of memory cells, the control circuit determining a state of the cycle transistor, and upon determining the cycle transistor being in an erased state (or a programmed state), the control circuit setting the reference transistor from a reference state to the erased state (or the programmed state), and then restoring the reference transistor from the erased state (or the programmed state) to the reference state. The reference state is set between the erased state and a programmed state.

19 Claims, 8 Drawing Sheets

NON-VOLATILE MEMORY DEVICE FOR MITIGATING CYCLING TRAPPED EFFECT AND CONTROL METHOD THEREOF

BACKGROUND OF THE INVENTION

1. Field of the Invention

The present invention relates to a memory device, and in particular, to a non-volatile memory device mitigating the cycling trapped effect and a control method thereof.

2. Description of the Prior Art

Non-volatile memories have been widely used in personal computers, telecommunications, consumer electronics and other fields. In particular, multi-time programmable (MTP) memories, electrically erasable programmable read-only memories (EEPROM) and flash memories are widely used non-volatile memory. Due to the defects of the gate oxide layer of the non-volatile memory, electrons are trapped in the gate oxide layer after multiple program/erase cycles, and the phenomenon is referred to as the cycling trapped effect. If electrons escape from the gate oxide layer, the data current generated by the non-volatile memory will shift away from the original value, and a data reading error might occur if a fixed reference current is adopted to read the non-volatile memory. In the related art, trimming techniques are used to manually adjust the reference current. Nevertheless, trimming can be time-consuming and inaccurate.

SUMMARY OF THE INVENTION

According to an embodiment of the invention, a non-volatile memory device includes a set of memory cells, a cycle transistor, a reference transistor and a control circuit, the control circuit being coupled to the set of memory cells, the cycle transistor and the reference transistor, and a method of controlling the non-volatile memory device includes in a program operation or an erase operation of the set of memory cells, the control circuit determining a state of the cycle transistor, and after determining that the cycle transistor is in an erased state, the control circuit setting the reference transistor from a reference state to the erased state, and then restoring the reference transistor from the erased state to the reference state. The reference state is set between the erased state and a programmed state.

According to another embodiment of the invention, a non-volatile memory device includes a set of memory cells, a cycle transistor, a reference transistor and a control circuit, the control circuit being coupled to the set of memory cells, the cycle transistor and the reference transistor, and a method of controlling the non-volatile memory device includes in a program operation or an erase operation of the set of memory cells, the control circuit determining a state of the cycle transistor, and after determining that the cycle transistor is in a programmed state, the control circuit setting the reference transistor from a reference state to the programmed state, and then restoring the reference transistor from the programmed state to the reference state. The reference state is set between an erased state and the programmed state.

According to another embodiment of the invention, a non-volatile memory device includes a set of memory cells, a cycle transistor, a reference transistor, a comparison circuit and a control circuit. The comparison circuit includes a first comparator coupled to the cycle transistor and the reference transistor, and is used to compare a cycle current generated by the cycle transistor with a reference current generate by the reference transistor during a program operation or an erase operation of the set of memory cells to generate a first comparison result. The control circuit is coupled to the set of memory cells, the cycle transistor, the reference transistor and the first comparator, and is used to control the operations of the cycle transistor and the reference transistor according to the first comparison result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
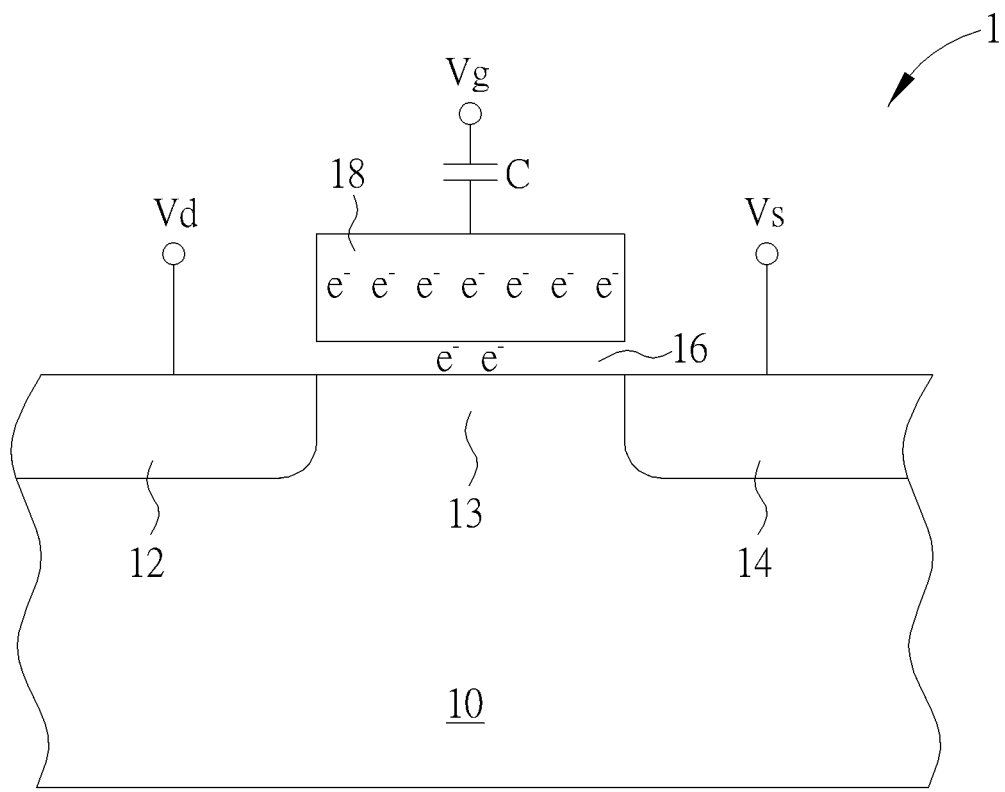
FIG. 1 is a schematic diagram of a non-volatile memory (NVM) cell according to an embodiment of the invention.

FIG. 1 is a schematic diagram of a non-volatile memory (NVM) cell 1 according to an embodiment of the invention. The NVM cell 1 may be a single-level multi-time programmable (MTP) memory cell, and may be represented by a transistor such as an N-type transistor. The NVM cell 1 includes a substrate 10, a source 14, a channel region 13, a drain 12, a gate oxide layer 16, a floating gate 18 and a capacitor C. The substrate 10 may be formed by a semiconductor, and the source 14 and the drain 12 may be formed by doped regions such as N-type doped regions. The channel region 13 may be formed between the source 14 and the drain 12 and below the floating gate 18. The gate oxide layer 16 may include silicon dioxide or other dielectric materials, and the floating gate 18 may include doped polysilicon.

The drain 12 may receive a drain voltage Vd, the source 14 may receive a source voltage Vs, the floating gate 18 may receive a gate voltage Vg via the capacitor C, and the substrate 10 may be grounded. A control circuit may control the drain voltage Vd, the source voltage Vs and the gate voltage Vg to program, erase or read the NVM cell 1.

During programming, the control circuit may generate consecutive pulses as the gate voltage Vg, each pulse having an equal magnitude, e.g. 9V, set the drain voltage Vd to a high voltage, e.g. 9V, and maintain the source voltage Vs at a ground voltage, e.g. 0V, to introduce negative charges to the floating gate 18. When the negative charges stored in the floating gate 18 reach a predetermined amount, e.g., 9 negative charges, the NVM cell 1 is set to a programmed state (or logic 0).

During erasing, the control circuit may set the drain voltage Vd to a high voltage, e.g., 9V, maintain the source voltage Vs at the ground voltage, and set the gate voltage Vg to the low voltage level, e.g., 0V, thereby removing the negative charges from the floating gate 18, resulting in zero negative charge in the floating gate 18, and setting the NVM cell 1 to an erased state (or logic 1).

During reading, the control circuit may set the gate voltage Vg to a read voltage, e.g., 2V, set the drain voltage Vd to the low voltage, and maintain the source voltage Vs at the ground voltage, thereby determining the data stored in the NVM cell 1 according to the data current of the drain 12, so as to complete a data reading operation. For example, if the NVM cell 1 is set to the programmed state, since there are negative charges in the floating gate 18, the formation of the channel region 13 may be difficult, and no or little data current can flow from the drain 12 to the source 14. Consequently, the control circuit may determine that the NVM cell 1 is in the programmed state according to the data current. If the NVM cell 1 is set in the erased state, since there is no negative charge in the floating gate 18, the channel region 13 may be formed, a larger current may flow from the drain 12 to the source 14, and consequently, the control circuit may determine that the NVM cell 1 is in the erased state according to the data current.

The control circuit may repeatedly perform program and erase operations on the NVM cell 1, and one program operation and one erase operation may be referred to as a program-erase (PE) cycle. As the number of PE cycles increases, negative charges may be trapped in the gate oxide layer 16, so the floating gate 18 only needs to store negative charge less than the predetermined amount to set the NVM cell 1 to the programmed state. For example, in FIG. 1, 2 negative charges are trapped in the gate oxide layer 16, so the floating gate 18 needs only to store 7 negative charges to achieve the programmed state (9 negative charges). However, the charge retention capability of the gate oxide layer 16 is not perfect. After a period of time, the negative charges will escape from the gate oxide layer 16, resulting in an increase in the data current in both the programmed state and the erased state, known as the cycling trapped effect. The cycling trapped effect may lead to the control circuit falsely determining the data in NVM cell 1.

Figure 2:
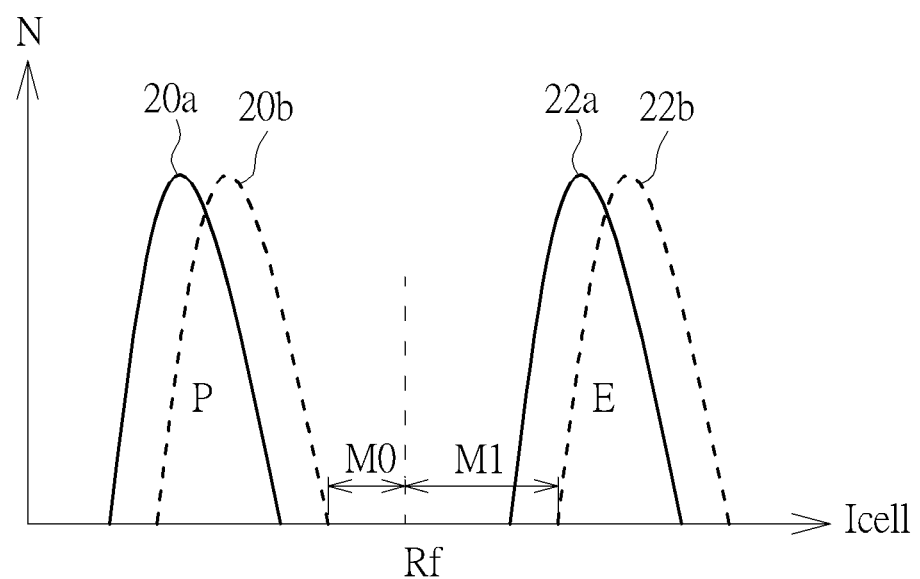
FIG. 2 shows a schematic diagram of the cycling trapped effect.

An NVM device may include a plurality of NVM cells 1 arranged in an array. Since the characteristics of individual NVM cells 1 may be slightly different from each other due to process, voltage and temperature (PVT), and the plurality of NVM cells 1 may form a distribution as in FIG. 2. FIG. 2 is a schematic diagram of the cycling trapped effect, wherein the horizontal axis represents the current Icell, and the vertical axis represents the number N. A distribution 20a represents the current distribution of a plurality of NVM cells 1 in the programmed state P without the cycling trapped effect, a distribution 22a represents the current distribution of a plurality of NVM cells 1 in the erased state E without the cycling trapped effect, a distribution 20b represents the current distribution of the plurality of NVM cells 1 in the programmed state P with the cycling trapped effect, and a distribution 22b represents the current distribution of the plurality of NVM cells 1 in the erased state E with the cycling trapped effect.

The related art employs a fixed reference current Rf to read data. The fixed reference current Rf may be generated by, for example, a bandgap reference circuit. The fixed reference current Rf may be approximately in the middle between the maximum data current of distribution 20a and the minimum data current of distribution 22a, thereby optimizing the read margin of the programmed state P and the read margin of the erased state E. If the data current of the NVM cell 1 exceeds the fixed reference current Rf, the control circuit may determine that the NVM cell 1 is in the erased state E, and if the data current of the NVM cell 1 is less than the fixed reference current Rf, the control circuit may determine that the NVM cell 1 is in the programmed state P. When the cycling trapped effect occurs, since the negative charges in the NVM cell 1 is reduced, the distribution 20a and the distribution 22a will shift to the right to form the distribution 20b and the distribution 22b, respectively. Since the fixed reference current Rf remains unchanged, the read margin M1 for the erased state E is increased and the read margin M0 for the programmed state P is decreased. If the negative charges in the NVM cell 1 is reduced too much, the data current of some NVM cells 1 in the distribution 20b may exceed the fixed reference current Rf, and the read margin M0 for the programmed state P may be less than 0, resulting in the control circuit falsely determining the NVM cells 1 in the distribution 20b being in the erased state E.

Figure 3:
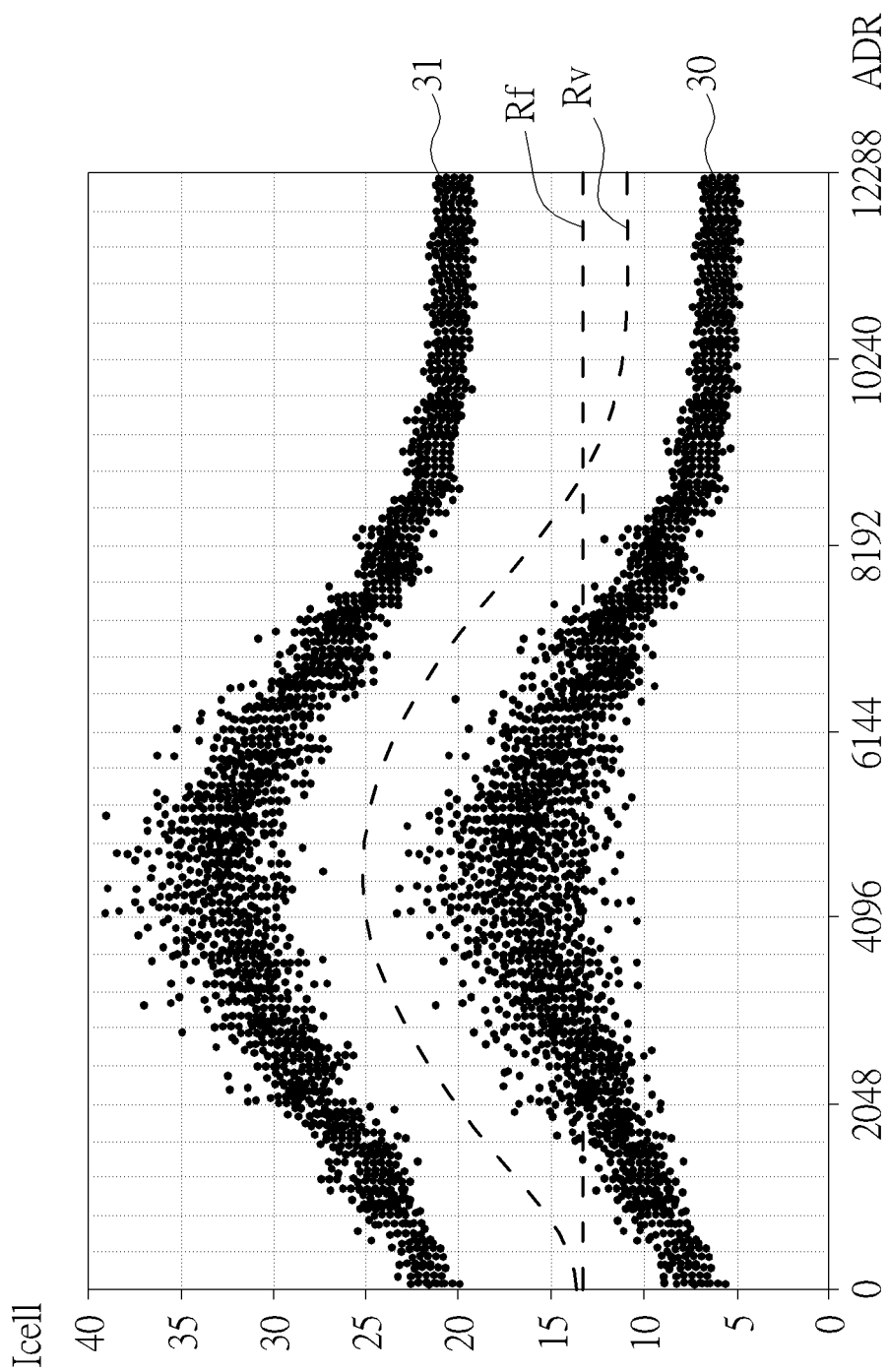
FIG. 3 shows cell distributions owing to the cycling trapped effect.

The cycling trapped effect is related to the physical location of the NVM cell 1. FIG. 3 shows a distribution of the cycling trapped effect, wherein the horizontal axis represents the address ADR, and the vertical axis represents the current Icell in microamperes. A distribution 31 represents the current distribution of NVM cells 1 in the erased state E, and a distribution 30 represents the current distribution of the NVM cells 1 in the programmed state P.

Both the distributions 30 and 31 show that the data currents generated from the middle addresses (e.g., between Address 2048 and Address 8192) are larger compared to low addresses (e.g., less than Address 2048) and high addresses (e.g., exceeding Address 8192). That is, the cycling trapped effect is location-dependent, wherein the cycling trapped effect of the NVM cells 1 at the middle address is more severe, and the cycling trapped effect of the NVM cells 1 at the upper addresses and the lower addresses is relatively insignificant. The NVM device in the embodiment may dynamically adjust reference currents ir according to the address, so as to enable the reference currents ir approximately located in the middle of the distribution 30 and the distribution 31 across all addresses, thereby optimizing the read margins for the programmed state P and the erased state E. In contrast, if the fixed reference current Rf (for example, Rf=13.5 µA) is adopted to read data as in the related art, the data currents of the NVM cell 1 at the middle addresses will exceed the fixed reference current Rf, resulting in falsely determination of the data state of the NVM cell 1 in the NVM device.

Figure 4A:
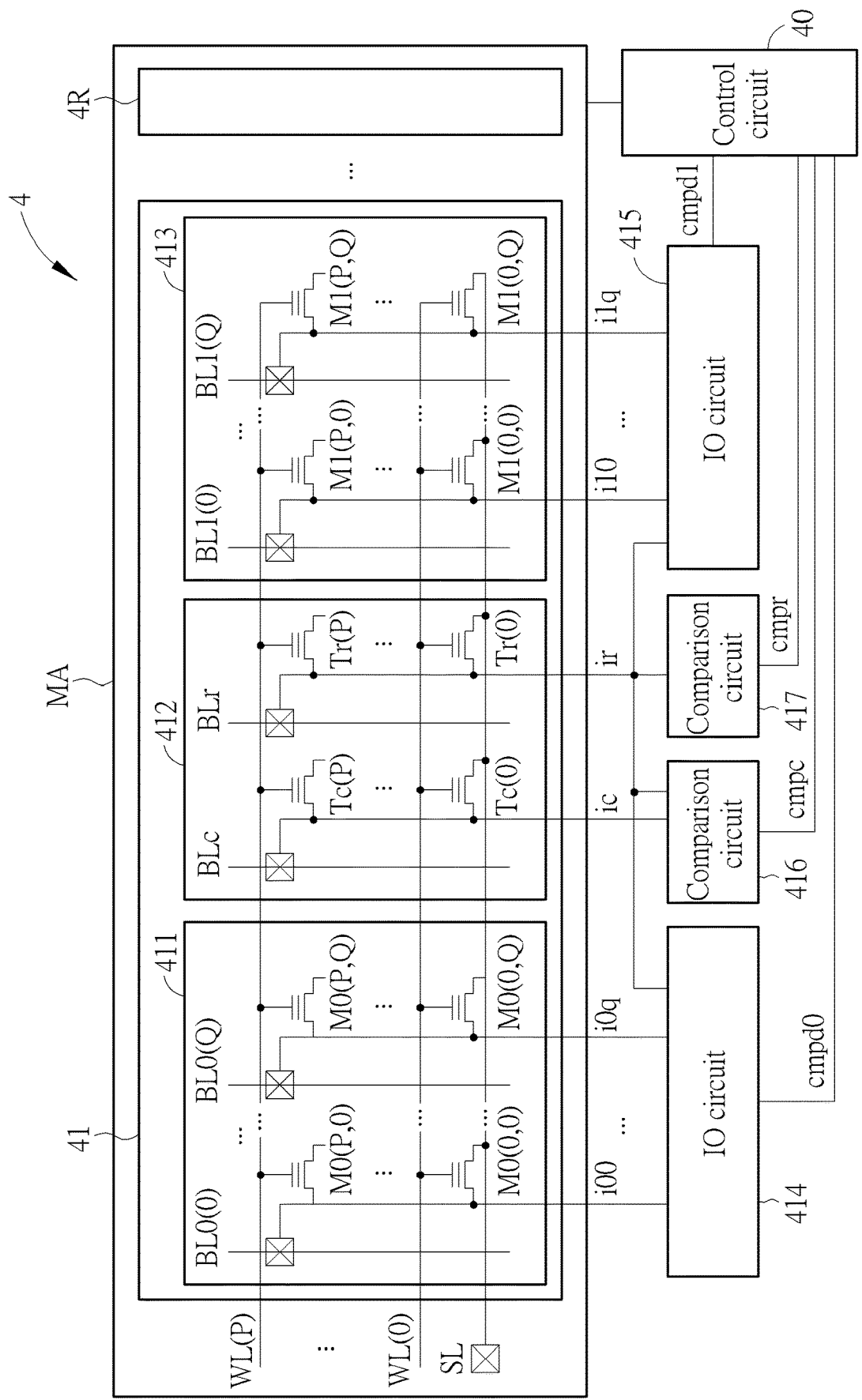
FIG. 4A is a schematic diagram of a NVM device according to an embodiment of the invention.

FIG. 4A is a schematic diagram of a NVM device 4 according to an embodiment of the invention. The NVM device 4 may dynamically adjust the reference currents ir according to the locations of the NVM cells, so as to optimize the read margins of the programmed state P and the erased state E, while preventing the NVM cells from being affected by the cycling trapped effect.

The NVM device 4 may include word lines WL(0) to WL(P), bit lines BL0(0) to BL0(Q), a bit line BLc, a bit line BLr, bit lines BL1(0) to BL1(Q), a source line SL, a memory array MA, an input/output (IO) circuit 414, an IO circuit 415, a comparison circuit 416, a comparison circuit 417 and a control circuit 40, where P and Q are positive integers, e.g., P is equal to 1023, and Q is equal to 15. The bit lines BL0(0) to BL0(Q), BLc, BLr, and BL1(0)-BL1(Q) may be local bit lines, global bit lines, or a combination thereof. The memory array MA includes groups 41 to 4R, R being a positive integer greater than 1, (e.g. R being equal to 16). The configuration and operation of each group are similar, and each group has corresponding IO circuits and comparison circuits. The configuration and operation of the group 41 are explained as follows. The group 41 corresponds to the IO circuit 414, the IO circuit 415, the comparison circuit 416 and the comparison circuit 417, and includes a first set of sub-memory cells 411, a reference current update circuit 412 and a second set of sub-memory cells 413. The first set of sub-memory cells 411 may include NVM cells M0(0,0) to M0(P,Q) arranged in a (P+1) by (Q+1) array, and the second set of sub-memory cells 413 may include NVM cells M1(0,0) to M1(P,Q) arranged in a (P+1) by (Q+1) array. The reference current update circuit 412 may include cycle transistors Tc(0) to Tc(P) arranged into a column of (P+1) rows, and reference transistors Tr(0) to Tr(P) arranged into a column of (P+1) rows.

The reference current update circuit 412 may be disposed, but is not limited to, between the first set of sub-memory cells 411 and the second set of sub-memory cells 413 to provide reference currents ir for reading the first set of sub-memory cells 411 and/or the second set of sub-memory cells 413. For example, in a 0.15-micrometer (μm) process, the width by length of each NVM cell may be 2.0 μm×3.93 μm, and the total width of 16 NVM cells may be 32 μm, each reference transistor Tr(0) to Tr(P)(hereinafter referred to as Tr) may each corresponds to 16 left NVM cells (32 μm) and 16 right NVM cells (32 μm), and the area overhead generated by the reference current update circuit 412 is 6.25% (=2/(16+16)). Each reference transistor Tr may be located closely to the 16 left NVM cells and the 16 right NVM cells, thus having a similar PVT environment, resulting in similar device characteristics. In some embodiments, the reference current update circuit 412 may be disposed at the left side or at the right side of the first set of sub-memory cells 411 and the second set of sub-memory cells 413, each reference transistor Tr may be located closely to the 32 NVM cells and have similar device characteristics. In other embodiments, the reference current update circuit 412 may be disposed between, at the left side or at the right side of other numbers of sub-memory cells to provide the reference current ir required for reading the other numbers of sub-memory cells. The greater the number of sub-memory cells associated with the reference current update circuit 412 is, the smaller the area overhead will be. For example, if the PVT variation is small, the reference current update circuit 412 may be arranged between the 2 left sets of sub-memory cells and the 2 right sets of sub-memory cells to provide the reference current ir for reading the 4 sets of sub-memory cells, the resulting area overhead is approximately 3.13%(=2/(32+32)). Those skilled in the art may arrange the reference current update circuit 412 where appropriate based on design requirements.

The NVM cells M0(0,0) to M0(P,Q), the NVM cells M1(0,0) to M1(P,Q), the cycle transistors Tc(0) to Tc(P) and the reference transistor Tr(0) to Tr(P) may be similar to the NVM cell 1 in the structure and operation, and the explanation therefor may be found in the preceding paragraphs and will not be repeated here. The word line WL(0) may be coupled to the floating gates of the NVM cells (M0(0,0) to M0(0,Q)) in the 0th row of the first set of sub-memory cells 411, the floating gate of the 0th row of the cycle transistor Tc(0), and the floating gates of the NVM cells (M1(0,0) to M1(0,Q)) in the 0th row of the second set of sub-memory cells 413. Similarly, the word lines WL(1) to WL(P) may be respectively coupled to the floating gates of the NVM cells in the first row to the Pth row of the first set of sub-memory cells 411, the floating gates of the cycle transistors Tc(1) to Tc(P), the floating gates of the reference transistors Tr(1) to Tr(P), and the floating gates of the NVM cells in the first row to the Pth row of the second set of sub-memory cells 413 in a similar fashion as the word line WL(0). The bit line BL0(0) may be coupled to the drains of the NVM cells M0(0,0) to M0(P,Q) in the 0th column of the first set of sub-memory cells 411. Similarly, the bit lines BL0(1) to BL0(Q) may be respectively coupled to the drains of the NVM cells in the first column to the Qth column of the first set of sub-memory cells 411, the bit line BLc may be coupled to the drains of the cycle transistors Tc(0) to Tc(P), the bit line BLr may be coupled to the drains of the reference transistors Tr(0) to Tr(P), and the bit lines BL1(0) to BL1(Q) may be respectively coupled to the drains of the NVM cells in the first column to the Qth column of the second set of sub-memory cells 413. The source line SL may be coupled to a ground terminal, the sources of the NVM cells M0(0,0) to M0(P,Q), the sources of the cycle transistors Tc(0) to Tc(P), the sources of the reference transistors Tr(0) to Tr(P), and the sources of NVM cells M1(0,0) to M1(P,Q), and the ground terminal may provide the ground voltage.

The IO circuit 414 may be coupled to the first set of sub-memory cells 411, the reference current update circuit 412 and the control circuit 40, and the control circuit 40 may read or write the NVM cell M0(0,0) to M0(P,Q) via the IO circuit 414. When reading a selected NVM cell in the NVM cells M0(0,0) to M0(P,Q), the IO circuit 414 may receive the respective data currents i00 to i0q via the bit lines BL0(0) to BL0(Q) and receive the reference current ir via the bit line BLr to generate a comparison result cmpd0, and output the comparison result cmpd0 to the control circuit 40.

The IO circuit 415 may be coupled to the second set of sub-memory cells 413, the reference current update circuit 412 and the control circuit 40, and the control circuit 40 may read or write the NVM cell M1(0,0) to M1(P,Q) via the IO circuit 415. The IO circuit 414 may be located adjacent to the IO circuit 415. When reading a selected NVM cell in the NVM cells M1(0,0) to M1(P,Q), the IO circuit 415 may receive the respective data currents i10 to i1q via the bit lines BL1(0) to BL1(Q) and receive the reference current ir via the bit line BLr to generate a comparison result cmpd1, and output the comparison result cmpd1 to the control circuit 40.

The comparison circuit 416 may be coupled to the reference current update circuit 412 and the control circuit 40, and the control circuit 40 may read or write the cycle transistors Tc(0) to Tc(P) via the comparison circuit 416. When reading a selected cycle transistor of the cycle transistors Tc(0) to Tc(P), the comparison circuit 416 may receive the cycle current is via the bit line BLc and the reference current ir via the bit line BLr to generate the comparison result cmpc, and output the comparison result cmpc to the control circuit 40. The comparison result cmpc indicates the state of the selected cycle transistor, for example, being the erased state E or the programmed state P.

The comparison circuit 417 may be coupled to the reference current update circuit 412 and the control circuit 40 for the control circuit 40 to read or write the reference transistors Tr(0) to Tr(P) via the comparison circuit 417. When reading a selected reference transistors Tr(0) to Tr(P), the comparison circuit 417 may receive the reference current ir via the bit line BLr to generate a comparison result cmpr, and output the comparison result cmpr to the control circuit 40, the comparison result cmpr indicates the state of the selected reference transistor, for example, being the erased state E, the programmed state P, or a reference state between the erased state E and the programmed state P.

The control circuit 40 may receive the comparison results cmpd0, cmpd1, cmpc and cmpr, and may be coupled to the group 41 to control the NVM cells M0(0,0) to M0(P,Q) and the NVM cells M1(0,0) to M1 (P, Q) via the word lines WL(0) to WL(P), the bit lines BL0(0) to BL0(Q), the bit line BLc, the bit line BLr, and the bit lines BL1(0) to BL1(Q) to control operations of the cycle transistors Tc(0) to Tc(P) and the reference transistors Tr(0) to Tr(P), and may transmit selection signals to the IO circuit 414, the IO circuit 415, the comparison circuit 416 and the comparison circuit 417 to control operations thereof.

The first set of sub-memory cells 411 and the second set of sub-memory cells 413 may form a set of memory cells. The cycle transistors Tc(0) to Tc(P) may be set to one of the programmed state P or the erased state E, respectively. Each cycle transistor Tc(0) to Tc(P) (hereinafter referred to as Tc) may be toggled between the programmed state P and the erased state E, that is, being switched from the programmed state P to the erased state E (for the erase operation), or from the erased state E to the programmed state P (for the program operation). The time required for the erase operation and program operation of each cycle transistor Tc is identical to that of the NVM cells in the set of memory cells, and therefore, the erase and program operations of the cycle transistor Tc may be performed simultaneously with the NVM cells without additional time. The reference transistors Tr(0) to Tr(P) may be set in respective small cycles according to the respective states of the cycle transistors Tc(0) to Tc(P) and then returned to the reference state, so as to generate the reference currents ir for the NVM cells in the 0th row to the Pth row of the set of memory cells. For example, the reference transistor Tr(0) may generate the reference current ir for the 0th row of the NVM cells in the set of memory cells. The respective reference states of the reference transistors Tr(0) to Tr(P) are located between the erased state E and the programmed state P.

Figure 4B:
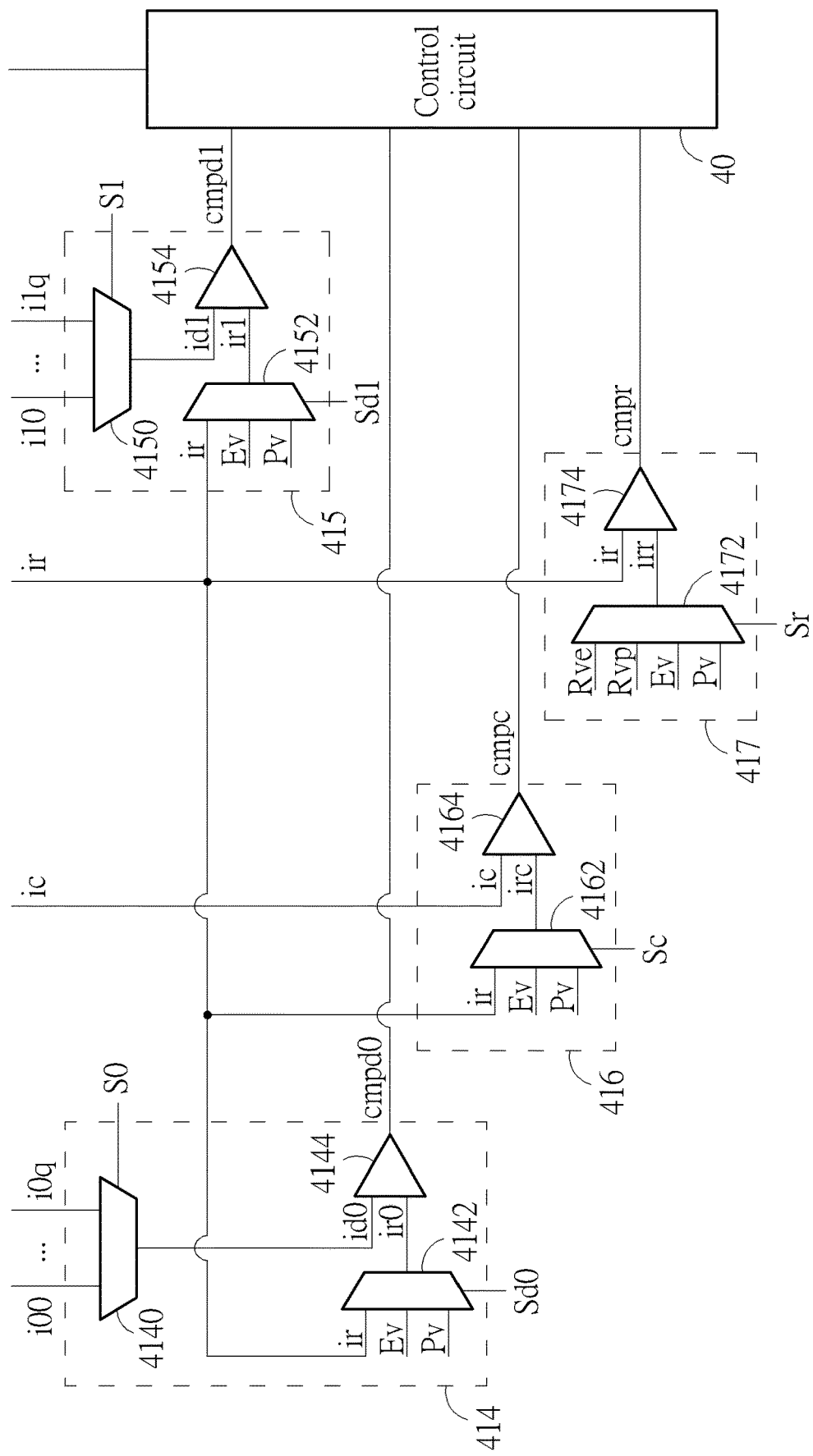
FIG. 4B is a schematic circuit diagram of a portion of the circuit of the NVM device in FIG. 4A.

FIG. 4B is a schematic circuit diagram of the IO circuit 414, the IO circuit 415, the comparison circuit 416, the comparison circuit 417, and the control circuit 40 in the NVM device 4. The IO circuit 414 may include a multiplexer 4140, a multiplexer 4142 and a comparator 4144. The multiplexer 4140 may include (Q+1) input terminals configured to receive the data currents i00 to i0q respectively; a selection terminal configured to receive a selection signal S0; and an output terminal configured to output a selected data current id0, wherein the selection signal S0 may be generated by the control circuit 40. The multiplexer 4140 may select one of the data currents i00 to i0q according to the selection signal S0 to be the selected data current id0 of the selected NVM cell. The multiplexer 4142 may include three input terminals configured to receive the reference current ir, a lower current limit Ev and a upper current limit Pv, respectively; a selection terminal configured to receive a selection signal Sd0; and an output terminal configured to output the selected reference current ir0, wherein the selection signal Sd0 may be generated by the control circuit 40. The multiplexer 4142 may select one of the reference current ir, the lower current limit Ev and the upper current limit Pv as the selected reference current ir0 according to the selection signal Sd0. The comparator 4144 may include a first input terminal configured to receive the selected data current id0; a second input terminal configured to receive the selected reference current ir0; and an output terminal configured to output the comparison result cmpd0.

Figure 5:
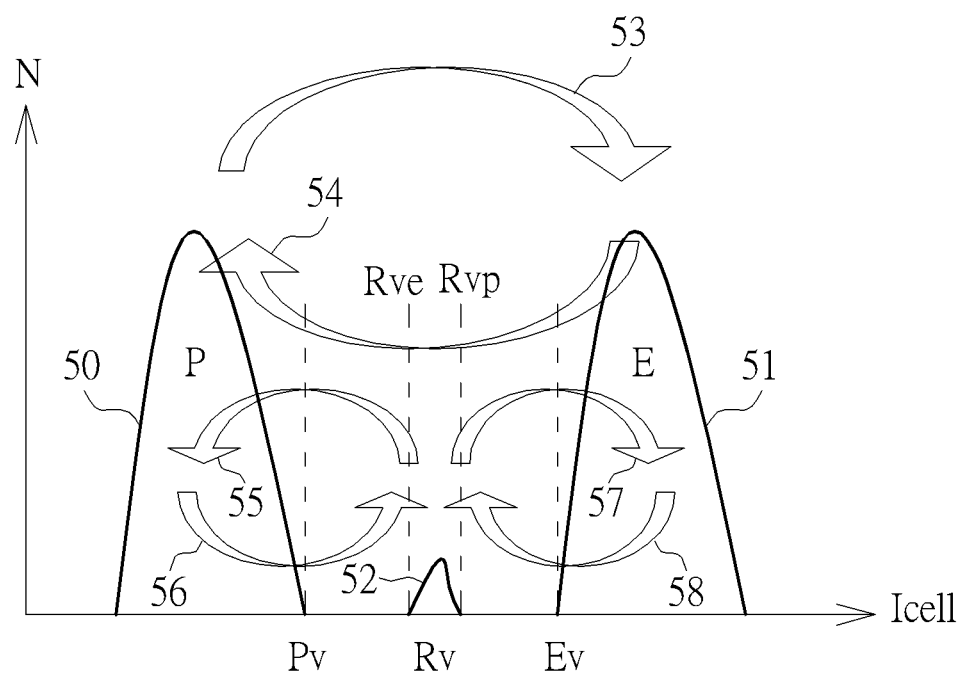
FIG. 5 is a schematic diagram illustrating a control method of the NVM device in FIG. 4A.

FIG. 5 shows current distributions of the NVM cells M0(0,0) to M0(P,Q), M1(0,0) to M1(P,Q), the cycle transistors Tc(1) to Tc(P) and the reference transistors Tr(0) to Tr(P), where the horizontal axis represents the current Icell and the vertical axis represents the number N. A distribution 50 represents the current distribution of the NVM cells M0(0,0) to M0(P,Q), M1(0,0) to M1(P,Q), the cycle transistors Tc(1) to Tc(P) and the reference transistors Tr(0) to Tr(P) in the programmed state P, a distribution 51 represents the current distribution of the NVM cells M0(0,0) to M0(P,Q), M1(0,0) to M1(P,Q), the cycle transistors Tc(1) to Tc(P) and the reference transistors Tr(0) to Tr(P) in the erased state E, and a distribution 52 represents the current distribution of the reference transistors Tr(0) to Tr(P) in the reference state Rv, wherein the reference state Rv is between the erased state E and the programmed state P. The distribution 50 may have the upper current limit Pv, the distribution 51 may have the lower current limit Ev, and the distribution 52 may have a lower current limit Rve and an upper current limit Rvp. A difference between the lower current limit Rve and the upper current limit Pv may be referred to as the read margin of the programmed state P, and a difference between the lower current limit Ev and the upper current limit Rvp may be referred to as the read margin of the erased state E. The operation of the IO circuit 414 will be explained below with reference to FIG. 5. When reading the selected memory cell, the multiplexer 4142 may select the reference current ir as the selected reference current ir0 according to the selection signal Sd0, and the comparator 4144 may compare the selected data current id0 with the selected reference current ir0 to generate the comparison result cmpd0. For example, if the selected data current id0 exceeds the selected reference current ir0, the comparison result cmpd0 may indicate that the selected memory cell is in the erased state E; and if the selected data current id0 is less than the selected reference current ir0, the comparison result cmpd0 may indicate that the selected memory cell is in the programmed state P. In a verification process after an attempt of writing the programmed state P to the selected memory cell, the multiplexer 4142 may select the upper current limit Pv as the selected reference current ir0 according to the selection signal Sd0, and the comparator 4144 may compare the selected data current id0 with the selected reference current ir0 to generate the comparison result cmpd0. For example, if the selected data current id0 exceeds the selected reference current ir0, the comparison result cmpd0 may indicate that the selected memory cell has not been set to the programmed state P, and thus the verification fails; and if the selected data current id0 is less than the selected reference current ir0, the comparison result cmpd0 may indicate that the selected memory cell has been successfully set to the programmed state P, and thus the verification is successful. In an erase verification process after an attempt of erasing the selected memory cells, the multiplexer 4142 may select the lower current limit Ev as the selected reference current ir0 according to the selection signal Sd0, and the comparator 4144 may compare the selected data current id0 with the selected reference current ir0 to produce the comparison result cmpd0. For example, if the selected data current id0 is less than the selected reference current ir0, the comparison result cmpd0 may indicate that the selected memory cell has not been set to the erased state E, and thus the erase verification fails; and if the selected data current id0 exceeds the selected reference current ir0, the comparison result cmpd0 may indicate that the selected memory cell has been successfully set to the erased state E, and thus the erase verification is successful.

Similar to the IO circuit 414, the IO circuit 415 may include a multiplexer 4150, a multiplexer 4152 and a comparator 4154. The multiplexer 4150 may include (Q+1) input terminals configured to receive the data currents i10 to i1q respectively; a selection terminal configured to receive a selection signal 51; and an output terminal configured to output the selected data current id1, wherein the selection signal 51 may be generated by the control circuit 40. The multiplexer 4150 may select one of the data currents i10 to i1q according to the selection signal 51 to be the selected data current id1 of the selected NVM cell. The multiplexer 4152 may include three input terminals configured to receive the reference current ir, the lower current limit Ev and the upper current limit Pv, respectively; a selection terminal configured to receive a selection signal Sd1; and an output terminal configured to output the selected reference current ir1, wherein the selection signal Sd1 may be generated by the control circuit 40. The multiplexer 4152 may select one of the reference current ir, the lower current limit Ev and the upper current limit Pv as the selected reference current ir1 according to the selection signal Sd1. The comparator 4154 may include a first input terminal configured to receive the selected data current id1; a second input terminal configured to receive the selected reference current ir1; and an output terminal configured to output the comparison result cmpd1. The operations of the multiplexer 4150, the multiplexer 4152 and the comparator 4154 are respectively similar to the multiplexer 4140, the multiplexer 4142 and the comparator 4144, the explanations therefor may refer to the preceding paragraphs, and will not be repeated here.

The comparison circuit 416 may include a multiplexer 4162 and a comparator 4164. The multiplexer 4162 may include three input terminals configured to receive the reference current ir, the lower current limit Ev and the upper current limit Pv, respectively; a selection terminal configured to receive a selection signal Sc; and an output terminal configured to output the selected reference current irc, wherein the selection signal Sc may be generated by the control circuit 40. The multiplexer 4162 may select one of the reference current ir, the lower current limit Ev and the upper current limit Pv as the selected reference current irc according to the selection signal Sc. The comparator 4164 may include a first input terminal configured to receive the cycle current ic; a second input terminal configured to receive the selected reference current irc; and an output terminal configured to output the comparison result cmpc. The operations of the multiplexer 4162 and the comparator 4164 are respectively similar to the multiplexer 4142 and the comparator 4144, the explanations therefore may refer to the preceding paragraphs, and will not be repeated here.

The comparison circuit 417 may include a multiplexer 4172 and a comparator 4174. The multiplexer 4172 may include 4 input terminals configured to receive the lower current limit Rve, the upper current limit Rvp, the lower current limit Ev and the upper current limit Pv, respectively; a selection terminal configured to receive a selection signal Sr; and an output terminal configured to output the selected reference current irr, wherein the selection signal Sc may be generated by the control circuit 40. The multiplexer 4172 may select one of the lower current limit Rve, the upper current limit Rvp, the lower current limit Ev and the upper current limit Pv as the selected reference current irr according to the selection signal Sr. The comparator 4174 may include a first input terminal configured to receive the reference current ir; a second input terminal configured to receive the selected reference current irr; and an output terminal configured to output the comparison result cmpr.

The operation of the comparison circuit 417 will be explained below with reference to FIG. 5. In a verification process after an attempt of programming the selected reference transistor from the reference state Rv to the programmed state P, the multiplexer 4172 may select the upper current limit Pv as the selected reference current irr according to the selection signal Sr, and the comparator 4174 may compare the reference current ir with the selected reference current irr to generate the comparison result cmpr. For example, if the reference current ir exceeds the selected reference current irr, the comparison result cmpr may indicate that the selected reference transistor has not been successfully set to the programmed state P, and thus the verification fails; and if the reference current ir is less than the selected reference current irr, the comparison result cmpr may indicate that the selected reference transistor has been successfully set to the programmed state P, and thus the verification is successful. In a verification process of programming the selected reference transistor from the programmed state P to the reference state Rv, the multiplexer 4172 may select the lower current limit Rve as the selected reference current irr according to the selection signal Sr, and the comparator 4174 may compare the reference current ir with the reference current irr to generate the comparison result cmpr. For example, if the reference current ir is less than the selected reference current irr, the comparison result cmpr may indicate that the selected reference transistor has not been set to the reference state Rv, and thus the verification fails; and if the reference current ir exceeds the selected reference current irr, the comparison result cmpr may indicate that the selected reference transistor has been set to the reference state Rv, and thus the verification is successful.

In a verification process after an attempt of programming the selected reference transistor from the reference state Rv to the erased state E, the multiplexer 4172 may select the lower current limit Ev as the selected reference current irr according to the selection signal Sr, and the comparator 4174 may compare the reference current ir with the selected reference current irr to generate the comparison result cmpr. For example, if the reference current ir is less than the selected reference current irr, the comparison result cmpr may indicate that the selected reference transistor has not been set to the erased state E, and thus the verification fails; and if the reference current ir exceeds the selected reference current irr, the comparison result cmpr may indicate that the selected reference transistor has been set to the erased state E, and thus the verification is successful. In a verification process of programming the selected reference transistor from the erased state E to the reference state Rv, the multiplexer 4172 may select the upper current limit Rvp as the selected reference current irr according to the selection signal Sr, and the comparator 4174 may compare the reference current ir with the reference current irr to generate the comparison result cmpr. For example, if the reference current ir exceeds the selected reference current irr, the comparison result cmpr may indicate that the selected reference transistor has not been set to the reference state Rv, and thus the verification fails; and if the reference current ir is less than the selected reference current irr, the comparison result cmpr may indicate that the selected reference transistor has been set to the reference state Rv, and thus the verification is successful.

FIG. 5 is a schematic diagram depicting a control method of the NVM device 4. In some embodiments, before shipping, the control circuit 40 may set the NVM cells M0(0,0) to M0(P,Q), the NVM cells M1(0,0) to M1 (P,Q), and the cycle transistors Tc(0) to Tc(P) to a default erased state E, and set the reference transistors Tr(0) to Tr(P) set to a default reference state Rv. The reference state Rv is located between the erased state E and the programmed state P. For example, the default state of the reference state Rv may be located substantially in the distribution 52 between the upper current limit Pv of the distribution 50 and the lower current limit Ev of the distribution 51, thereby optimizing the read margins of the programmed state P and the erased state E of the plurality of NVM cells. The NVM cells M0(0,0) to M0(P,Q), the NVM cells M1(0,0) to M1(P,Q), and the cycle transistors Tc(0) to Tc(P) may be switched between the erased state E and the programmed state P. During a program operation, any selected NVM cell in the distribution 51 may be switched from the erased state E to the programmed state P via a program cycle 54. During an erase operation, any selected NVM cell in the distribution 50 may be switched from the programmed state P to the erased state E via an erase cycle 53. The PE cycle includes the erase cycle 53 and the program cycle 54.

For example, during a program operation or an erase operation of an NVM cell in the 0th row of the set of memory cells, the control circuit 40 may read the reference transistor Tr(0) to generate the reference current ir, and read the cycle transistor Tc(0) to generate the cycle current ic, the comparator 416 may compare the cycle current ic and the reference current ir to generate the comparison result cmpc, and the control circuit 40 may control the cycle transistor Tc(0) and the reference transistor Tr(0) according to the comparison result cmpc. If the cycle current ic exceeds the reference current ir, the comparison result cmpc indicates that the cycle transistor Tc(0) is in the erased state E; and if the cycle current ic is less than the reference current ir, the comparison result cmpc indicates that the cycle transistor Tc(0) is in the programmed state P. If the comparison result cmpc indicates that the cycle transistor Tc(0) is in the erased state E, the control circuit 40 may switch the cycle transistor Tc(0) from the erased state E to the programmed state P. The control circuit 40 may sequentially set the reference transistor Tr(0) from the reference state Rv to the erased state E via a cycle 57, and restore the reference transistor Tr(0) from the erased state E to the reference state Rv via a cycle 58.

During a program operation or an erase operation of an NVM cell in the 0th row of the memory cells, if the comparison result cmpc indicates that the cycle transistor Tc(0) is in the programmed state P, the control circuit 40 may switch the cycle transistor Tc(0) from the programmed state P to the erased state E. The control circuit 40 may sequentially set the reference transistor Tr(0) from the reference state Rv to the programmed state P via a cycle 55, and restore the reference transistor Tr(0) from the programmed state P to the reference state Rv via a cycle 56. Therefore, the reference transistor Tr(0) undergoes the cycles 55 to 58 in each PE cycle. Since the cycle 55 is equivalent to a portion of the program cycle 54, the cycle 58 is equivalent to the remaining portion of the program cycle 54, the cycle 56 is equivalent to a portion of the erase cycle 53, and the cycle 57 is equivalent to the remaining portion of the erase cycle 53, the net charge change in the cycles 58 and 55 is approximately equal to the charge change in the program cycle 54, and the net charge change in the cycles 56 and 57 is approximately equal to the charge change in the erase cycle 53. In this fashion, the reference transistor Tr(0) also undergoes a PE cycle, allowing the reference transistor Tr(0) and the NVM cells in the 0th row of the set of memory cells to experience a similar level of the cycling trapped effect, and after a period of time, the currents of the reference transistor Tr(0) and the NVM cells in the 0th row of the set of memory cells will shift towards a similar direction and in a similar amount, so as to optimize the read margins of the erased state E and the programmed state P of the NVM cells in the 0th row of the set of memory cells. For example, in FIG. 5, if the programmed state P and the erased state E of the NVM cells in the 0th row of the set of memory cells are in the distributions 50 and 51, respectively, and the reference transistor Tr(0) is in the distribution 52. After a period of time, the distributions 50, 51 and 52 will all shift to the right by a similar amount, resulting in the read margins of the programmed state P and the erased state E staying unchanged, being favorable for accurately reading data from the NVM cells. Further, since the reference transistor Tr(0) and the NVM cells in row 0 of the set of memory cells are in close proximity, if the PVT environment changes, the distributions 50, 51 and 52 will all shift to the left/right by a similar amount, resulting in the read margins of the programmed state P and the erased state E staying unchanged, and being favorable for accurately reading data from the NVM cells.

During the read operation of the NVM cell M1(0,0) of the set of memory cells, the control circuit 40 may read the reference transistor Tr(0) to generate the reference current ir, and read the NVM cell M1(0,0) to generate the data current id, the comparator 415 may compare the reference current ir with the data current id to generate a comparison result cmpd1, and the control circuit 40 may determine the data of the NVM cell M1(0,0) according to the comparison result cmpd1. If the data current id exceeds the reference current ir, the comparison result cmpd1 will indicate that the NVM cell M1(0,0) is in the erased state E, and if the data current id is less than the reference current ir, the comparison result cmpd1 will indicate that the NVM cell M1(0,0) is in the programmed state P.

While the NVM cells in the NVM device 4 are MTP memory cells, those skilled in the art would recognize that other types of NVM cells, such as electrically erasable programmable Read-only memory (electrically erasable programmable read-only memory, EEPROM) NOR flash memory and NAND flash memory, may also be adopted in the NVM device 4 based on actual requirements. Furthermore, while the NVM cell in the NVM device 4 is a single-level memory cell, those skilled in the art may change the reference transistor configurations of the reference current update circuit 412 according to actual requirements, so as to apply the present invention to multi-level memory cells. For example, for a double level memory cell, each NVM cell may store 2 bits of data and may be set to one of 4 states, the reference current update circuit 412 may include 3 references transistors to generate three reference current levels for reading the three programmed states according to the embodiments of the present invention.

Figure 6:
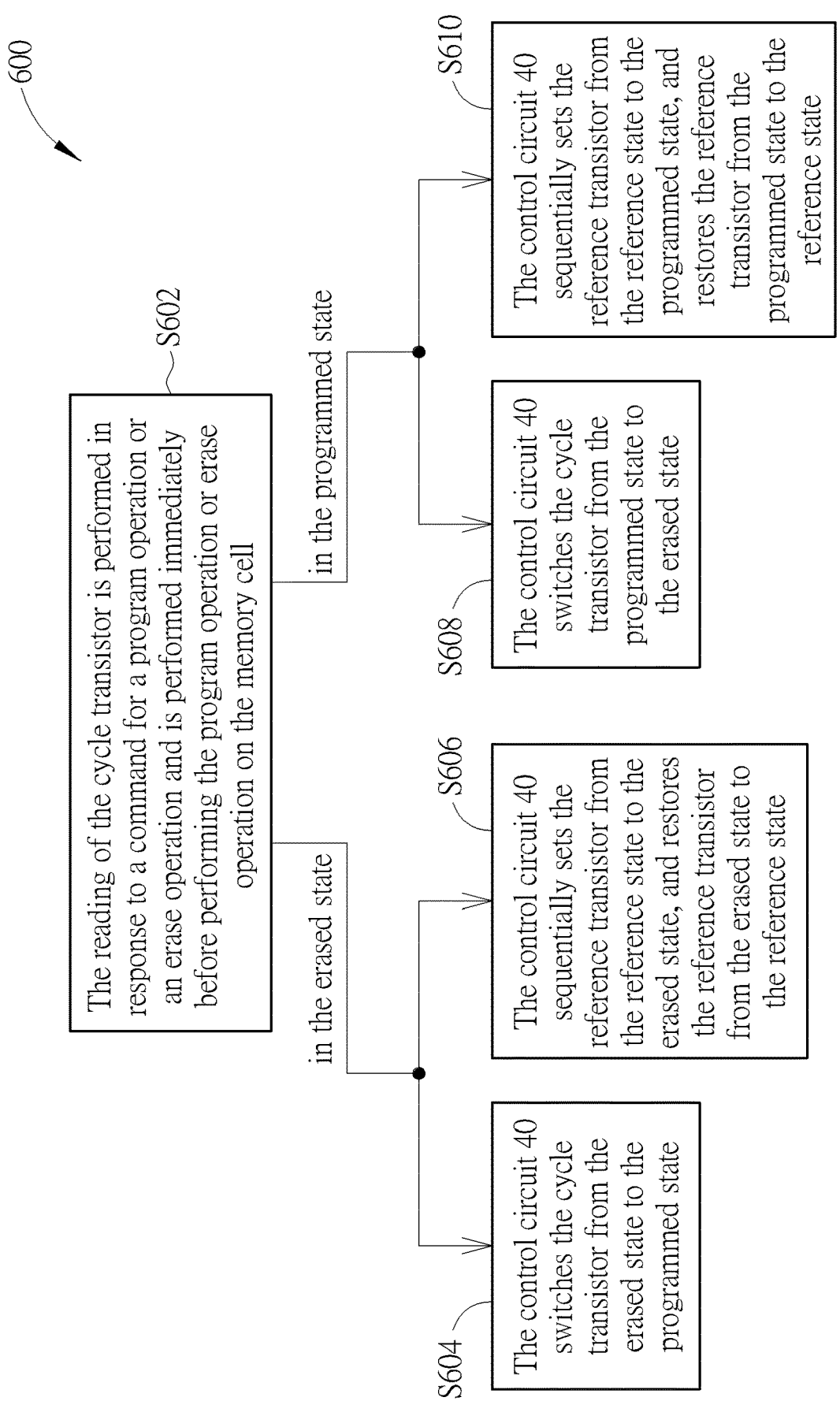
FIG. 6 is a flowchart of a control method of the NVM device in FIG. 4A.

FIG. 6 is a flowchart of a control method 600 of the NVM device 4. The control method 600 includes Steps S602 to S610, wherein Steps S604 and S606 are used to control the operations of the cycle transistor and the reference transistor after determining that the cycle transistor is in the erased state E, and Steps S608 and S610 are used to control the operations of the cycle transistor and the reference transistor after determining that the cycle transistor is in the programmed state P. Any reasonable step change or adjustment is within the scope of the present disclosure. Steps S602 to S610 are detailed as follows:

Step S602: The reading of the cycle transistor is performed in response to a command for a program operation or an erase operation and is performed immediately before performing the program operation or erase operation on the memory cell; if the cycle transistor is in the erased state, proceed to Step S604 and Step S606; if the cycle transistor is in the programmed state, proceed to Step S608 and Step S610;

Step S604: The control circuit 40 switches the cycle transistor from the erased state to the programmed state;

Step S606: The control circuit 40 sequentially sets the reference transistor from the reference state to the erased state, and restores the reference transistor from the erased state to the reference state;

Step S608: The control circuit 40 switches the cycle transistor from the programmed state to the erased state;

Step S610: The control circuit 40 sequentially sets the reference transistor from the reference state to the programmed state, and restores the reference transistor from the programmed state to the reference state.

Before shipping, all the cycle transistors and the NVM cells in the NVM device 4 are set to the erased state E, and all the reference transistors are set to the default state (initial reference state Rv). In Step S602, after receiving a program command or an erase command for a set of memory cells (i.e., the first set of sub-memory cells 411 and the second set of sub-memory cells 413), the control circuit 40 determines that the set of memory cells is to perform a program operation or an erase operation, and reads the state of the cycle transistor. The set of NVM cells may be a row of NVM cells, a plurality of rows of NVM cells, or a portion of NVM cells, e.g., the set of NVM cells may be the 0th row in the first set of sub-memory cells 411 or the 0th row in the second set of sub-memory cells 413.

If it is determined in Step S602 that the cycle transistor is in the erased state E, then in Step S604, the control circuit 40 switches the cycle transistor from the erased state E to the programmed state P, and in Step S606, the control circuit 40 sequentially switches the reference transistor from the reference state Rv to the erased state E, and restores the reference transistor from the erased state E to the reference state Rv, thereby enabling the reference transistor to undergo the cycles 57 and 58. Step S604 and Step S606 may be performed simultaneously.

If it is determined in Step S602 that the cycle transistor is in the programmed state P, then in Step S608, the control circuit 40 switches the cycle transistor from the programmed state P to the erased state E, and in Step S606, the control circuit 40 sequentially switches the reference transistor from the reference state Rv to the programmed state P, and restores the reference transistor from the programmed state P to the reference state Rv, thereby enabling the reference transistor to undergo the cycles 55 and 56. Step S608 and Step S610 may be performed simultaneously. After the set of NVM cells completes one PE cycle, the reference transistor also completes one equivalent PE cycle. Therefore, the reference transistor and the set of NVM cells experience a similar level of the cycling trapped effect, resulting in the read margins of the programmed state P and the erased state E staying unchanged without being degraded.

Figure 7:
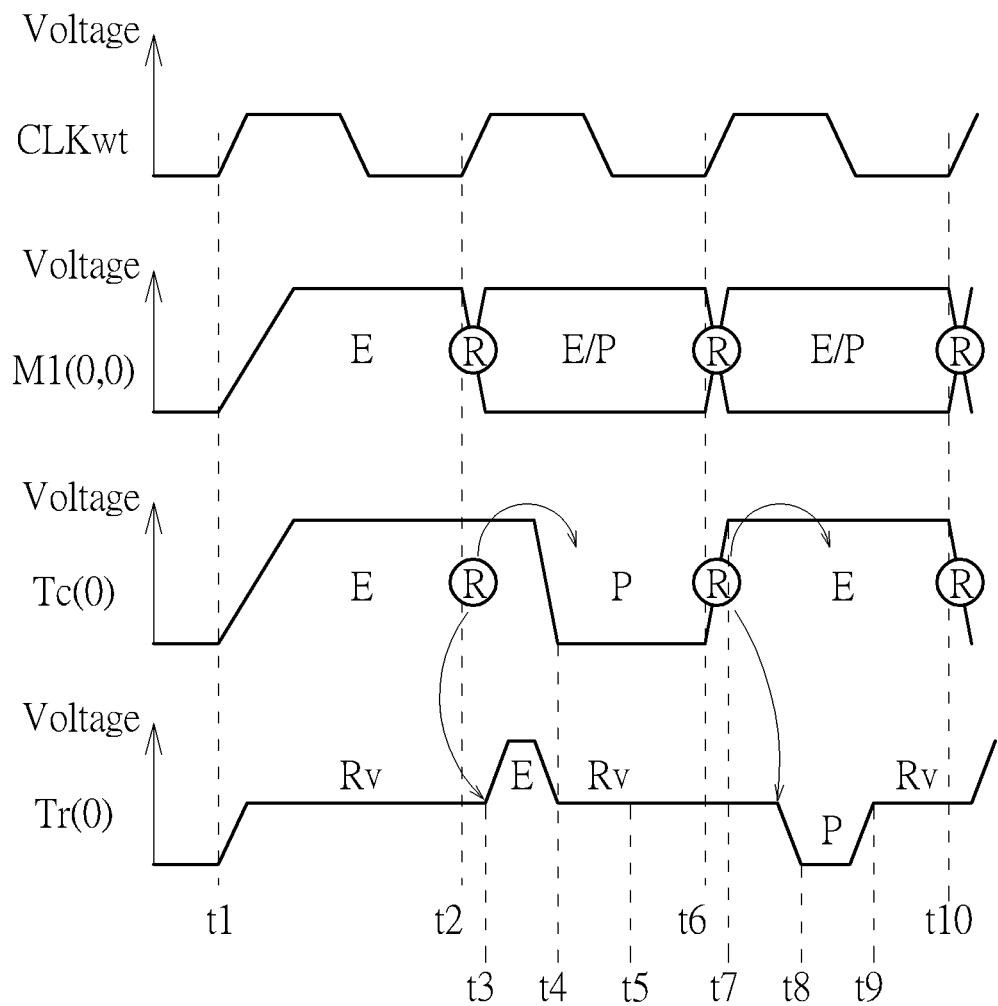
FIG. 7 is a timing diagram of a program/erase operation of the NVM device in FIG. 4A.

FIG. 7 is a timing diagram of the PE cycle of the NVM device 4, showing the clock signal CLKwt, the NVM cell M1(0,0), the state of the cycle transistor Tc(0) and the state of the reference transistor Tr(0). The clock signal CLKwt is used to perform the erase/program operation of the NVM cell M1(0,0). Between Time t1 and Time t2, the NVM cell M1(0,0) and the cycle transistor Tc(0) are initialized to the erased state E, and the reference transistor Tr(0) is initialized to the reference state Rv. At Time t2, the control circuit 40 receives the erase/program command for the NVM cell M1(0,0), and the clock signal CLKwt starts to rise. Between Time t2 and Time t3, the control circuit 40 performs a read operation (R) on the NVM cell M1(0,0) and the cycle transistor Tc(0) to read the original state (E) of the NVM cell M1(0,0) and the original state (E) of the cycle transistor Tc(0), the reference transistor Tr(0) is maintained in the reference state Rv. Between Time t3 and Time t4, the erase operation is performed, the cycle transistor Tc(0) is maintained in the erased state E, and the NVM cell M1(0,0) is set to the target state (E). Since the original state of the cycle transistor Tc(0) is the erased state E, the reference transistor Tr(0) is set from the reference state Rv to the erased state E. The NVM cell M1(0,0) is to be switched only when the original state of the NVM cell M1(0,0) is different from the target state, for example, the original state is the erased state E and the target state is the programmed state P, or the original state is the programmed state P and the target state is the erased state E. Between Time t4 and Time t5, the program operation is performed, the cycle transistor Tc(0) is switched from the erased state E to the programmed state P, the reference transistor Tr(0) is switched from the erased state E to the reference state Rv, and the NVM cell M1(0,0) is set to the target state (P). In some embodiments, the length between Time t3 and Time t4 and the length between Time t4 and Time t5 may be similar, during the period between Time t3 and Time t4 the erased state E is set, and during the period between Time t4 and Time t5 the programmed state P is set.

At Time t6, the clock signal CLKwt starts to rise, and the control circuit 40 receives the next command of the NVM cell M1(0,0) within the PE cycle (an erase command if the command received at Time t2 was a program command). Between Time t6 and Time t7, the control circuit 40 performs a read operation (R) on the NVM cell M1(0,0) and the cycle transistor Tc(0) to read the original state (E/P) of the NVM cell M1(0,0) and the original state (P) of the cycle transistor Tc(0).

Between Time t7 and Time t8, the erase operation is performed, the NVM cell M1(0,0) is set to the target state (E), the cycle transistor Tc(0) is switched from the programmed state P to the erased state E, and the reference transistor Tr(0) is maintained in the reference state Rv. Between Time t8 and Time t9, the program operation is performed, the NVM cell M1(0,0) is set to the target state (P), and since the original state of the cycle transistor Tc(0) is the programmed state P, the reference transistor Tr(0) is switched from the reference state Rv to the programmed state P, while the cycle transistor Tc(0) remains unchanged. In some embodiments, the length between Time t7 and Time t8 and the length between Time t8 and Time t9 may be similar, the erased state E is set during the period between Time t7 and Time t8, and the programmed state P is set during the period between Time t8 and Time t9. Between Time t9 and Time t10, the erase operation is performed, the reference transistor Tr(0) is restored from the programmed state P to the reference state Rv, the cycle transistor Tc(0) is maintained in the erased state E, and the NVM cell M1(0,0) remain in the target state (E or P).

The Time t2 to Time t10 may be regarded as a PE cycle, and the NVM device 4 may repeat the operations between the Time t2 to Time t10 to enable the reference transistor Tr(0) and the NVM cell M1(0,0) to experience a similar level of cycling trapped effect, resulting in the read margins of the programmed state P and the erased state E staying unchanged, and being favorable for accurately reading the NVM cell.

Figure 8:
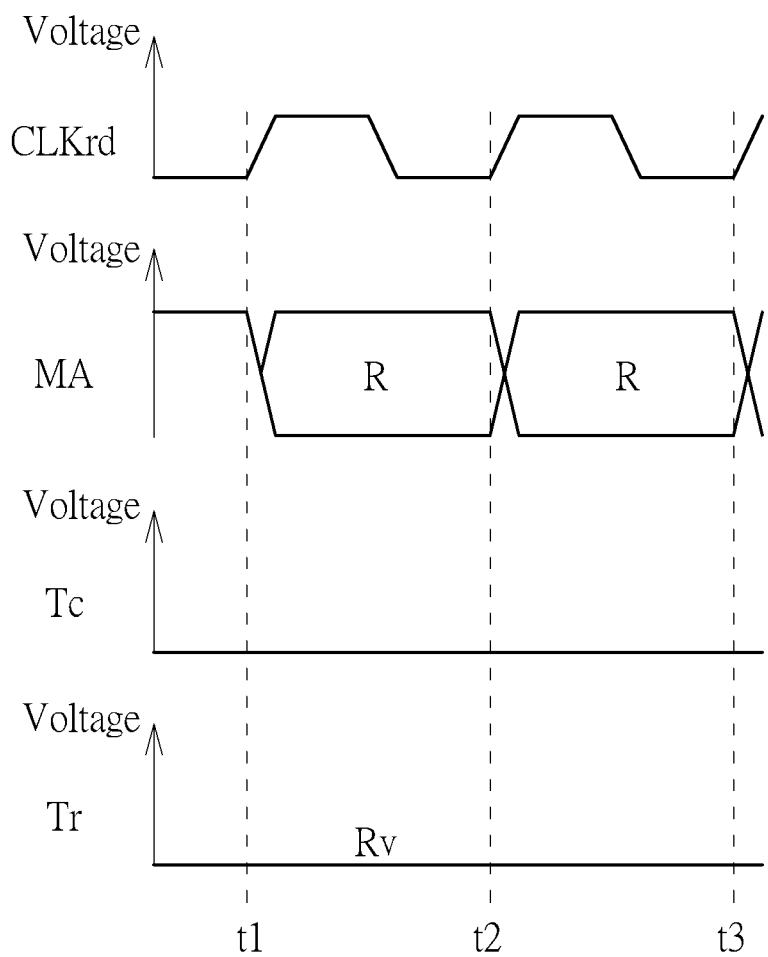
FIG. 8 is a timing diagram of a read operation of the NVM in FIG. 4A.

FIG. 8 is a timing diagram of the read operation of the NVM device 4, showing the clock signal CLKrd, the memory array MA, the state of the cycle transistor Tc and the state of the reference transistor Tr. The clock signal CLKrd is used to read the memory array MA. At Time t1, the control circuit 40 receives a read command for the first set of selected NVM cells of the memory array MA, and the clock signal CLKrd starts to rise. Between Time t1 and Time t2, the control circuit 40 performs a read operation (R) on the first set of selected NVM cells, the corresponding reference transistor Tr of the first set of selected NVM cells is maintained in the reference state Rv, and the cycle transistor Tc is maintained in original state (E/P). At Time t2, the control circuit 40 receives a read command for the second set of selected NVM cells of the memory array MA, and the clock signal CLKrd starts to rise. Between Time t2 and Time t3, the control circuit 40 performs a read operation (R) on the second set of selected NVM cells, the corresponding reference transistor Tr of the second set of selected NVM cells is maintained in the reference state Rv, and the cycle transistor Tc is maintained in original state (E/P). The NVM device 4 may repeat the operations between Time t1 and Time t2 to read the sets of selected NVM cells.

The NVM device 4 and the control method 600 thereof in the embodiment shown in FIGS. 4A and 6 use the cycle transistor and the reference transistor to adjust the reference current at the corresponding position, resulting in the read margins of the programmed state P and the erased state E staying unchanged without degradation, being favorable for accurately reading the data from the NVM cells.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of controlling a non-volatile memory device, the non-volatile memory device comprising a set of memory cells, a cycle transistor, a reference transistor and a control circuit, the control circuit performing a program operation or an erase operation on the set of memory cells in response to a command, the control circuit being coupled to the set of memory cells, the cycle transistor, and the reference transistor, the method comprising:
   before performing the program operation or the erase operation of the set of memory cells, the control circuit determining a state of the cycle transistor; and
   in response to determining that the cycle transistor is in an erased state, the control circuit sequentially setting the reference transistor from a reference state to the erased state, and restoring the reference transistor from the erased state to the reference state, the reference state being between the erased state and a programmed state.

2. The method of claim 1, further comprising: after determining that the cycle transistor is in the erased state, the control circuit switching the cycle transistor from the erased state to the programmed state.

3. The method of claim 1, further comprising:
   during a read operation of the set of memory cells, the control circuit reading a state of the reference transistor to generate a reference current, reading a memory cell of the set of memory cells to generate a data current, and comparing the reference current with the data current to determine a data of the memory cell.

4. The method of claim 1, further comprising:
   setting the reference transistor to a default state between the erased state and the programmed state.

5. The method of claim 1, further comprising:
   comparing a cycle current generated by the cycle transistor with a reference current generated by the reference transistor to determine whether the cycle transistor is in the erased state or the programmed state.

6. A method of controlling a non-volatile memory device, the non-volatile memory device comprising a set of memory cells, a cycle transistor, a reference transistor and a control circuit, the control circuit performing a program operation or an erase operation on the set of memory cells in response to a command, the control circuit being coupled to the set of memory cells, the cycle transistor, and the reference transistor, the method comprising:
   before performing the program operation or the erase operation of the set of memory cells, the control circuit determining a state of the cycle transistor; and
   in response to determining that the cycle transistor is in a programmed state, the control circuit sequentially setting the reference transistor from a reference state to the programmed state, and restoring the reference transistor from the programmed state to the reference state, the reference state being between an erased state and the programmed state.

7. The method of claim 6, further comprising: after determining that the cycle transistor is in the programmed state, the control circuit switching the cycle transistor from the programmed state to the erased state.

8. The method of any of claim 6, further comprising:
   during a read operation of the set of memory cells, the control circuit reading a state of the reference transistor to generate a reference current, reading a memory cell of the set of memory cells to generate a data current, and comparing the reference current with the data current to determine a data of the memory cell.

9. The method of any of claim 6, further comprising:
   setting the reference transistor to a default state between the erased state and the programmed state.

10. The method of any of claim 6, further comprising:
    comparing a cycle current generated by the cycle transistor with a reference current generated by the reference transistor to determine whether the cycle transistor is in the erased state or the programmed state.

11. A non-volatile memory device comprising:
    a set of memory cells;
    a cycle transistor;
    a reference transistor;
    a comparison circuit comprising:
        a first comparator coupled to the cycle transistor and the reference transistor, and configured to compare a cycle current generated by the cycle transistor with a reference current generate by the reference transistor before performing the a program operation or an erase operation of the set of memory cells to generate a first comparison result; and
    a control circuit coupled to the set of memory cells, the cycle transistor, the reference transistor and the first comparator, and configured to control the operations of the cycle transistor and the reference transistor according to the first comparison result.

12. The non-volatile memory device of claim 11, wherein when the first comparison result indicates that the cycle transistor is in an erased state, the control circuit is configured to sequentially set the reference transistor from a reference state to the erased state, and restore the reference transistor from the erased state to the reference state, the reference state being between the erased state and a programmed state.

13. The non-volatile memory device of claim 12, wherein when the first comparison result indicates that the cycle transistor is in the erased state, the control circuit is further configured to switch the cycle transistor from the erased state to the programmed state.

14. The non-volatile memory device of claim 11, wherein when the first comparison result indicates that the cycle transistor is in a programmed state, the control circuit is configured to sequentially set the reference transistor from a reference state to the programmed state, and restore from the programmed state to the reference state, the reference state being between an erased state and the programmed state.

15. The non-volatile memory device of claim 14, wherein when the first comparison result indicates that the cycle transistor is in the programmed state, the control circuit is further configured to switch the cycle transistor from the programmed state to the erased state.

16. The non-volatile memory device of claim 11, further comprising:

an input/output circuit including a second comparator coupled to the reference transistor and the set of memory cells, and configured to compare a reference current generated by the reference transistor with a data current generated by a memory cell of the set of memory cells to generate a second comparison result; and the control circuit is configured to determine data of the memory cell according to the second comparison result.

17. The non-volatile memory device of claim 16, wherein the set of memory cells comprises:

a first set of sub-memory cells coupled to the input/output circuit; and a second set of sub-memory cells is coupled to another input/output circuit.

18. The non-volatile memory device of claim 17, wherein the input/output circuit is located adjacent to the another input/output circuit.

19. The non-volatile memory device of claim 11, wherein:

the control circuit is configured to set the reference transistor to a preset state between the erased state and the programmed state.

* * * * *